US007377002B2

(12) United States Patent
Yudovsky et al.

(10) Patent No.: US 7,377,002 B2
(45) Date of Patent: May 27, 2008

(54) SCRUBBER BOX

(75) Inventors: Joseph Yudovsky, Campbell, CA (US); Avi Tepman, Cupertino, CA (US); Kenneth R. Reynolds, Los Gatos, CA (US); Younes Achkire, Los Gatos, CA (US); Dan A. Marohl, San Jose, CA (US); Steve G. Ghanayem, Los Altos, CA (US); Alexander S. Polyak, San Jose, CA (US); Gary Ettinger, Cupertino, CA (US); Haochuan Zhang, Milpitas, CA (US); Hui Chen, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 396 days.

(21) Appl. No.: 10/976,012

(22) Filed: Oct. 28, 2004

(65) Prior Publication Data

US 2005/0087212 A1    Apr. 28, 2005

Related U.S. Application Data

(60) Provisional application No. 60/514,937, filed on Oct. 28, 2003.

(51) Int. Cl.
*B08B 1/04* (2006.01)
(52) U.S. Cl. .............................. 15/77; 15/88.2; 15/88.3
(58) Field of Classification Search .................... 15/77, 15/88.2, 88.3
See application file for complete search history.

(56) References Cited

U.S. PATENT DOCUMENTS

| 4,382,308 | A | 5/1983 | Curcio |
| 5,475,889 | A | 12/1995 | Thrasher et al. |
| 5,486,129 | A | 1/1996 | Sandhu et al. |
| 5,700,180 | A | 12/1997 | Sandhu et al. |
| 5,743,784 | A | 4/1998 | Birang et al. |
| 5,846,882 | A | 12/1998 | Birang |
| 5,943,726 | A | 8/1999 | Eitoku et al. |
| 6,059,888 | A | 5/2000 | Hillman |
| 6,070,284 | A | 6/2000 | Garcia et al. |
| 6,143,089 | A | 11/2000 | Stephens et al. |
| 6,254,688 | B1 * | 7/2001 | Kobayashi et al. ............ 134/1 |

(Continued)

FOREIGN PATENT DOCUMENTS

CA    2 248 459 A1    3/2000

(Continued)

*Primary Examiner*—Shay L Karls
(74) *Attorney, Agent, or Firm*—Dugan & Dugan (57) ABSTRACT

A scrubber box is provided that includes a tank adapted to receive a substrate for cleaning, supports outside of the tank and adapted to couple to ends of scrubber brushes disposed within the tank, a motor mounted to each of the supports and adapted to rotate the scrubber brushes, a base to which the supports are pivotally mounted via spherical bearings adapted to permit toe-in of the scrubber brushes, a brush gap actuator adapted, via a crank and rocker mechanism, to substantially simultaneously pivot the supports toward or away from each other so as to permit the scrubber brushes to substantially simultaneously achieve or break contact with the substrate, and a toe-in actuator adapted to move two of the spherical bearings toward or away from each other so as to adjust a toe-in angle between the scrubber brushes.

5 Claims, 11 Drawing Sheets

U.S. PATENT DOCUMENTS

| | | |
|---|---|---|
| 6,269,510 B1 | 8/2001 | Beardsley et al. |
| 6,352,596 B2 | 3/2002 | Beardsley et al. |
| 6,425,158 B2 | 7/2002 | Ravkin |
| 6,575,177 B1 * | 6/2003 | Brown et al. ............... 134/76 |
| 6,623,334 B1 | 9/2003 | Birang et al. |
| 6,676,493 B1 * | 1/2004 | Owczarz et al. ............ 451/67 |
| 6,739,013 B2 | 5/2004 | Glashauser et al. |
| 6,887,129 B2 | 5/2005 | Birang |
| 6,986,185 B2 * | 1/2006 | Sugarman et al. ........... 15/77 |
| 2002/0005212 A1 | 1/2002 | Beardsley et al. |
| 2002/0116773 A1 * | 8/2002 | Anderson ..................... 15/4 |
| 2003/0131872 A1 * | 7/2003 | Nishihara .................... 134/6 |

FOREIGN PATENT DOCUMENTS

| | | |
|---|---|---|
| GB | 2 276 537 A | 10/1994 |
| JP | 02303580 | 12/1990 |
| JP | 05-129260 | 5/1993 |

* cited by examiner

SCRUBBER BOX

This application claims priority to U.S. Provisional Application Ser. No. 60/514,937, filed Oct. 28, 2003 and entitled "Scrubber Box And Methods For Using The Same," which is hereby incorporated by reference herein in its entirety for all purposes.

RELATED APPLICATIONS

The present application is related to the following commonly-assigned, co-pending U.S. patent applications, both of which are hereby incorporated herein by reference in their entirety for all purposes:

U.S. Pat. No. 6,986,185 entitled "Methods and Apparatus for Determining Scrubber Brush Pressure."

U.S. Pat. No. 6,918,864 entitled "Roller That Avoids Substrate Slippage."

FIELD OF THE INVENTION

The present invention relates generally to electronic device manufacturing, and more particularly to a scrubber box for cleaning thin discs such as semiconductor substrates or wafers, compact discs, glass substrates and the like.

BACKGROUND

Known devices, sometimes referred to as scrubbers, are often employed to clean semiconductor substrates at one or more stages of an electronic device manufacturing process. For example, a scrubber may be employed to clean a substrate after chemical mechanical polishing (CMP) of the substrate. Known scrubbers employ one or more scrubber brushes that are rotated while in contact with the substrate to thereby clean the substrate.

While a number of scrubber systems exist in the art, a need remains for improved scrubber designs.

SUMMARY

In a first aspect of the invention, an apparatus is provided that includes a linkage adapted to support scrubber brushes. The linkage includes a base and brush supports pivotally coupled to the base. The apparatus also includes an actuator adapted to pivot the brush supports in concert such that scrubber brushes supported by the brush supports substantially simultaneously achieve contact with, or break contact with, respective major surfaces of a substrate.

In a second aspect of the invention, a method is provided that includes inserting a substrate into a scrubber box, concurrently pivoting opposing brush supports together through a single arc to engage a substrate with brushes supported by the brush supports, and rotating the brushes to clean the substrate.

In a third aspect of the invention, an apparatus is provided that includes a brush support adapted to rotatably hold a scrubber brush, a motor adapted to rotate the scrubber brush held in the brush support, an actuator coupled to the brush support and adapted to move the brush support to allow the scrubber brush to engage a substrate, and a controller coupled to the motor and actuator. The controller is adapted to locate a zero point position of the scrubber brush based upon a change in torque exerted by the motor to rotate the scrubber brush as the actuator moves the brush support.

In a fourth aspect of the invention, an apparatus is provided that includes a base, brush supports adapted to rotatably support scrubber brushes, spherical bearings slideably mounted to the base and coupled to the brush supports, and an actuator disposed between the spherical bearings. The actuator is adapted to adjust a toe-in position of the scrubber brushes by moving the brush supports.

In a fifth aspect of the invention, an apparatus is provided that includes a rotary shaft adapted to receive a scrubber brush, a rotary support, and a fluid lubricated bearing mounted on the rotary support and coupled to the rotary shaft. The rotary shaft includes an axially-disposed process fluid channel and the fluid lubricated bearing includes a fluid lubrication entry point coupled to the process fluid channel of the rotary shaft.

In a sixth aspect of the invention, an apparatus is provided that includes a roller adapted to rotate a substrate in a scrubber box, a sensor adapted to indicate an occurrence of a defined amount of rotation of the substrate, and a controller coupled to the sensor and adapted to determine a rate of rotation of the substrate.

In a seventh aspect of the invention, an apparatus is provided that includes a roller adapted to rotate a substrate in a scrubber box tank, a roller support, and a fluid lubricated bearing mounted on the roller support and coupled to the roller. The roller includes an axially-disposed process fluid channel and the fluid lubricated bearing includes a fluid lubrication entry point coupled to the process fluid channel of the roller.

In an eighth aspect of the invention, a scrubber box is provided that includes a tank adapted to receive a substrate for cleaning, supports outside of the tank and adapted to couple to ends of scrubber brushes disposed within the tank, a motor mounted to each of the supports and adapted to rotate the scrubber brushes, a base to which the supports are pivotally mounted via spherical bearings adapted to permit toe-in of the scrubber brushes, a brush gap actuator adapted, via a crank and rocker mechanism, to substantially simultaneously pivot the supports toward or away from each other so as to permit the scrubber brushes to substantially simultaneously achieve or break contact with the substrate, and a toe-in actuator adapted to move two of the spherical bearings toward or away from each other so as to adjust a toe-in angle between the scrubber brushes.

Numerous other aspects are provided, as are apparatus, systems and computer program products in accordance with these and other aspects of the invention. Each computer program product described herein may be carried by a medium readable by a computer (e.g., a carrier wave signal, a floppy disc, a compact disc, a DVD, a hard drive, a random access memory, etc.).

Other features and aspects of the present invention will become more fully apparent from the following detailed description, the appended claims and the accompanying drawings.

DETAILED DESCRIPTION

Inventive Scribber Box Linkage

Figure 1A:
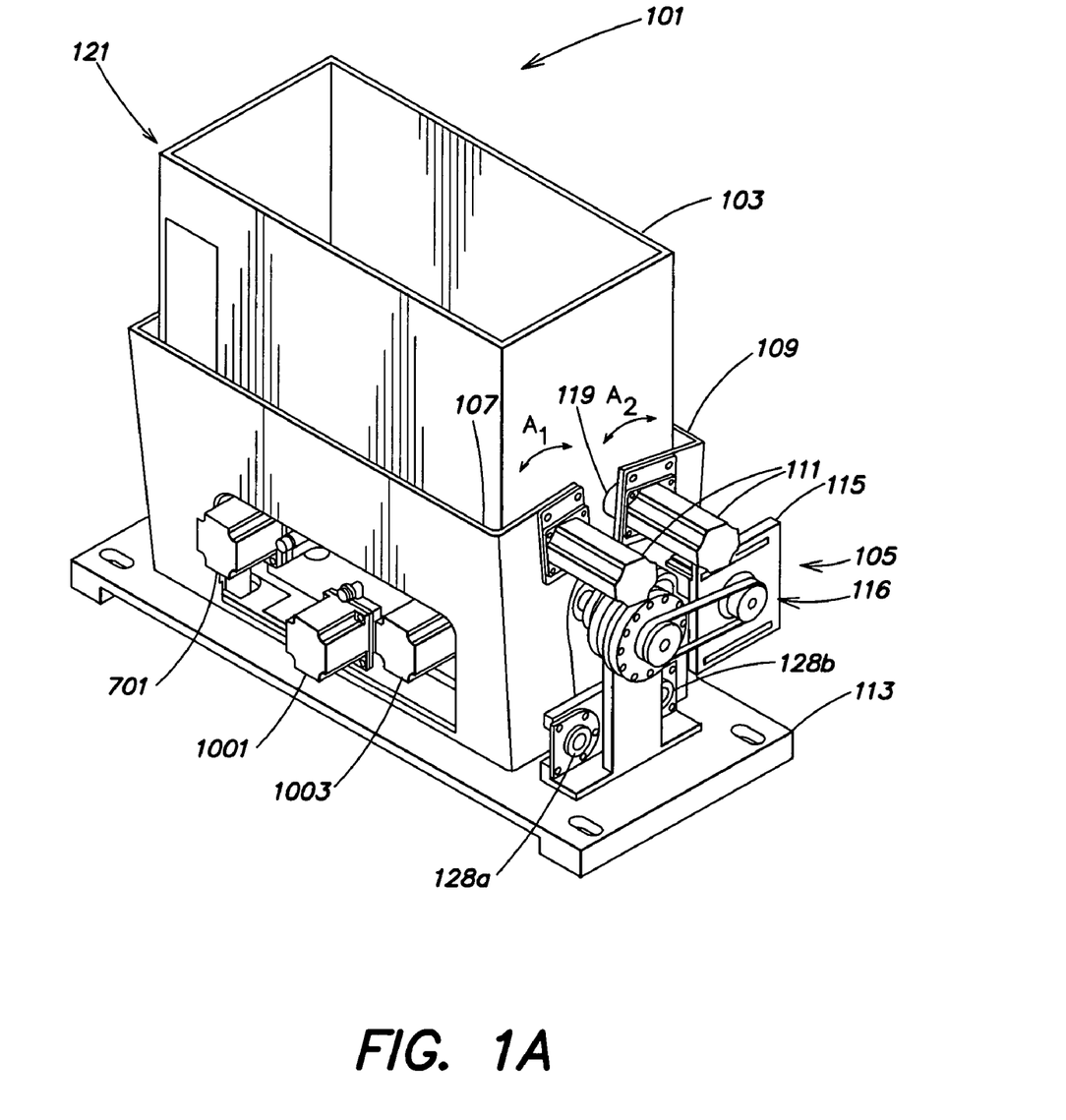
FIGS. 1A and 1B are a side perspective view and simplified top view, respectively, of an inventive scrubber box provided in accordance with the present invention.
Figure 1B:
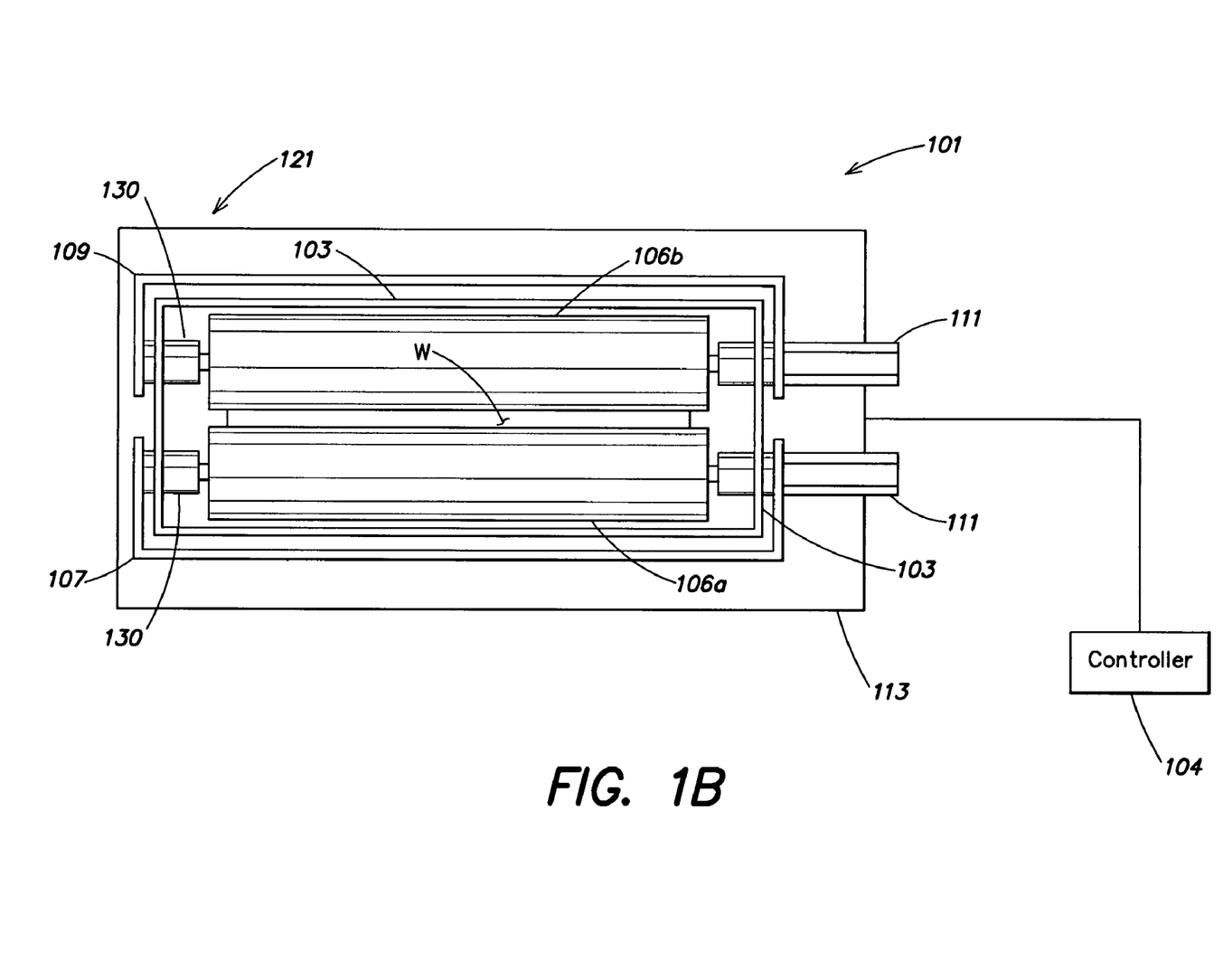
Figure 2:
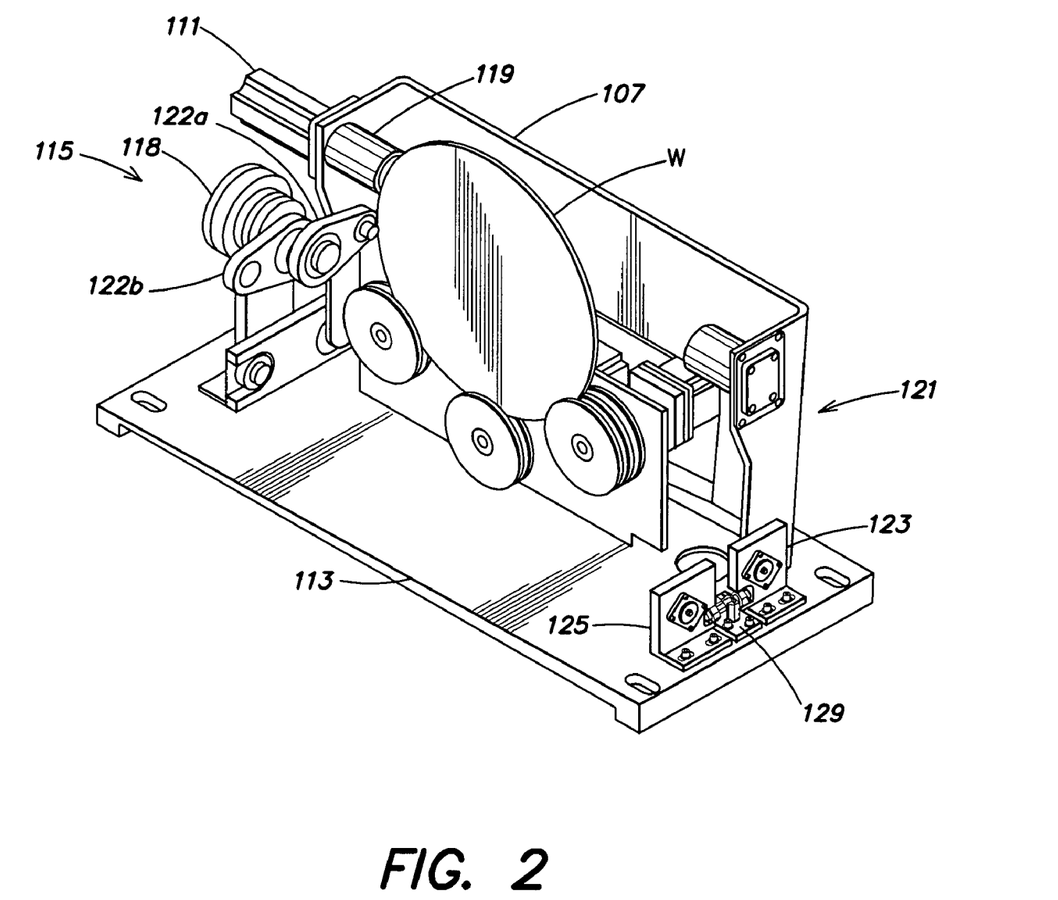
FIG. 2 is a partial perspective view, rotated by 180° relative to FIG. 1A, showing internal components of the inventive scrubber box.

FIGS. 1A and 1B are a side perspective view and simplified top view, respectively, of an inventive scrubber box 101 provided in accordance with the present invention. FIG. 2 is a partial perspective view, rotated by 180° relative to FIG. 1A, showing internal components of the inventive scrubber box 101.

Referring to FIGS. 1A-2, the scrubber box 101 includes a tank 103 and a linkage 105. The linkage 105 is external to (i.e., outside of) the tank 103 of the scrubber box 101 and may be employed for convenient and accurate actuation/movement of one or more scrubber brushes 106a-b (FIG. 1B) located inside the tank 103 relative to the major surfaces of a substrate W (FIGS. 1B and 2). The linkage 105 may comprise a first support 107 for rotationally supporting the first scrubber brush 106a at both ends of the first scrubber brush 106a, and a second support 109 for rotationally supporting the second scrubber brush 106b at both ends of the second scrubber brush 106b. Drive motors 111, such as direct drive servo motors, for rotating each scrubber brush 106a-b may also be mounted, one on each support 107, 109 outside the tank 103. For example, each motor 111 may be oriented in line with an end of a scrubber brush 106a-b and mounted to the support 107, 109 where the support 107, 109 rotationally supports the end of the scrubber brush 106a-b. The linkage 105 may further comprise a base 113, also disposed outside the tank 103, to which each of the first and second supports 107, 109 may be coupled (e.g., in common so as to facilitate precise and/or cooperative positioning and/or orientation of the scrubber brushes 106a-b relative to an anticipated plane of rotation of the substrate W as described below) and relative to which the first and second supports 107, 109 may be adapted to pivot (e.g. upward and inward toward one another, and/or downward and outward away from one another).

In operation, the first and second supports 107, 109 may be moved simultaneously through respective arcs $A_1$, $A_2$ (FIG. 1A) relative to the base 113 (e.g., via a plurality of spherical and/or gimbal-type bearings as described further below). Such movement may cause the first and second scrubber brushes 106a-b to close against the substrate W as shown in FIG. 1B, or to cause a gap (not shown) to be opened between the first and second scrubber brushes 106a-b to allow insertion and/or removal of the substrate W from the scrubber box 101. For example, a first actuator 115 may be mounted to the base 113, and may be caused to precisely move the first and second supports 107, 109 in concert such that the first and second scrubber brushes 106a-b may (1) simultaneously achieve contact with, or break contact with, respective major surfaces of the substrate W; and/or (2) achieve similar degrees of compression against respective major surfaces of the substrate W when closed against the substrate W.

In some embodiments, the path of the first and second scrubber brushes 106a-b follow arcs $A_1$, $A_2$ (FIG. 1A) which (in contrast to the arcs $A_1$, $A_2$ depicted in FIG. 1A) may be disposed so as to form a single continuous arc. In other words, the path of the first and second scrubber brushes 106a-b may comprise an arc wherein the first scrubber brush 106a moves along one half of the single arc and the second scrubber brush 106b moves along the other half of the arc. This single arc path of motion may help provide a symmetric and consistent interaction between the scrubber brushes 106a-b and the substrate W.

In some embodiments, the scrubber box 101 may include a controller 104 (FIG. 1B) for directing operation of the motors 111, actuators 115, 129 (FIG. 4), and/or other devices. The controller 104 may be operative to execute program instructions provided to it in the form of software code. In some embodiments, the controller 104 may include circuitry or otherwise be adapted to measure the torque exerted by the motors 111, actuators 115, 129, and/or other devices.

Figure 3:
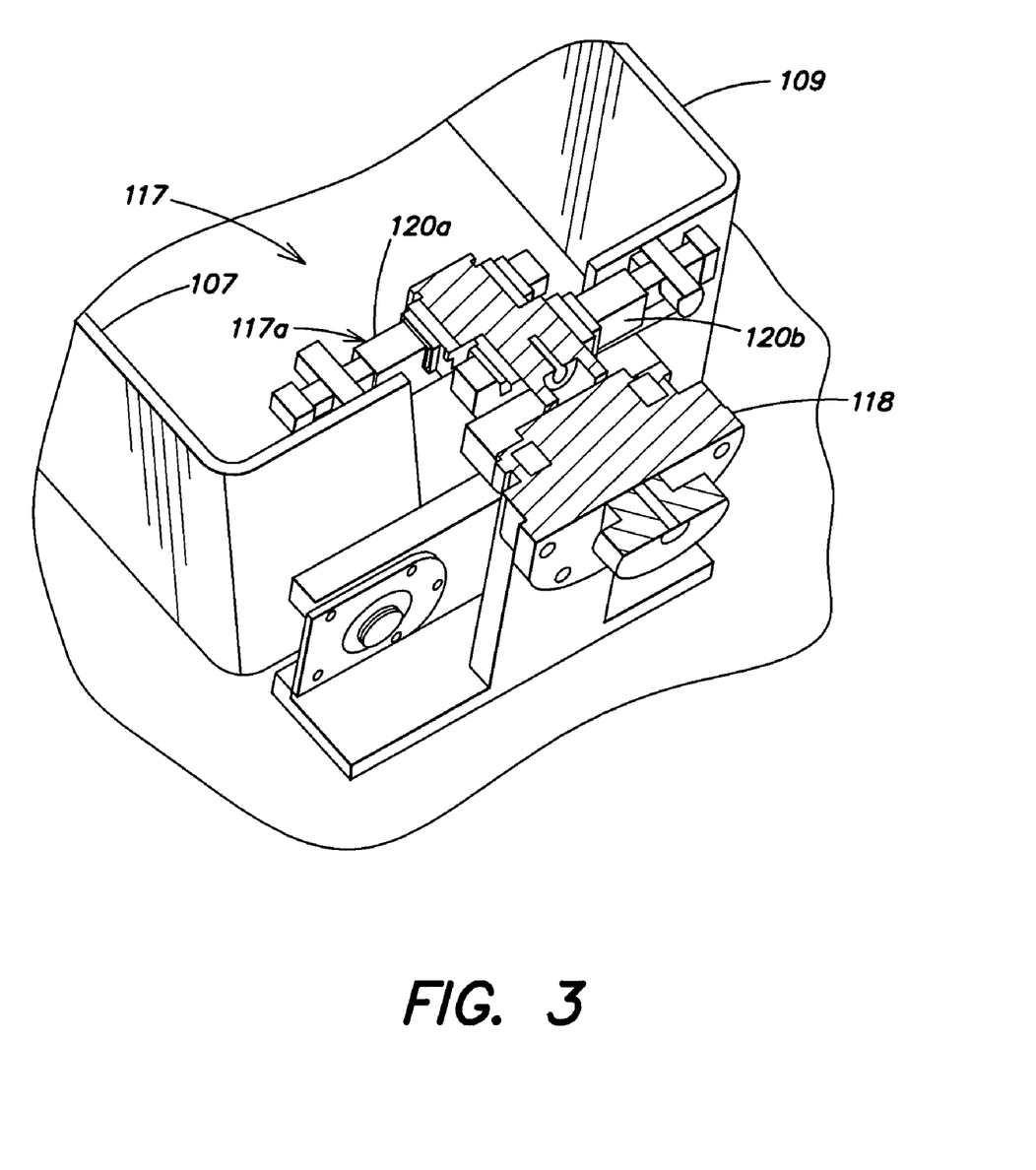
FIG. 3 is a partial, perspective view of an exemplary crank and rocker mechanism for placing scrubber brushes in or out of contact with a substrate in accordance with the invention.

In one or more embodiments, the first actuator 115 comprises a harmonic drive or other suitable motor or drive mechanism 116, and is coupled to the first and second supports 107, 109 via a crank and rocker mechanism 117 (FIG. 3) to provide equivalent motion of both supports. FIG. 3 is a partial, perspective view of an exemplary crank and rocker mechanism 117 provided in accordance with the invention. The crank and rocker mechanism 117 may include a crank shaft linkage mechanism 117a with a two-eccentric crank 118 (FIG. 2) driven by the first actuator 115 (FIG. 1A). In one particular embodiment, a first crank arm 120a is driven by one of the eccentrics of the crank 118 (e.g., eccentric 122a in FIG. 2) so as to rotate and/or move the first support 107, and a second crank arm 120b is driven by the other eccentric of the crank 118 (e.g., eccentric 122b in FIG. 2) so as to rotate and/or move the second support 109. Different embodiments for moving the supports 107, 109 may be provided, such as a cam with two cam followers, lead screws, etc.

Additionally, in one or more embodiments, clearance holes (not shown) may be formed in the tank 103 to achieve rotational coupling between the brushes 106a-b and the supports 107, 109. A geometrically compliant coupling element 119 (FIGS. 1A and 2), such as a bellows, may be disposed around each such hole and mounted between the tank 103 and the support 107, 109. Such an arrangement may (1) permit relative motion of the scrubber brushes 106a-b relative to the walls of the tank 103; (2) protect the substrate W against particulate contamination that might otherwise pass into the interior of the tank 103 through the holes in the tank walls; and/or (3) permit a fluid level in the tank 103 to reach or exceed the level of the holes while preventing fluid from draining therethrough.

Maintaining Consistent Scrubbing Force Via Torque Monitoring and Zero-point Calibration In one or more embodiments of the invention, a scrubbing force imposed by the first and second scrubbing brushes 106a-b (FIG. 1B) on the major surfaces of the substrate W (FIG. 2) may be kept consistent despite progressive wear of scrubbing surfaces of the brushes 106a-b and/or variation in locations or orientations of components of the scrubber box 101 due to unavoidable manufacturing or assembly tolerances. For example, a desired amount of scrubbing force $F_s$ to be imparted in a normal direction against a major surface of the substrate W by one of the first and second scrubbing brushes 106a-b supported by the first and second supports 107, 109 may be determined in advance, and may be defined by the following equation:

$$F_s = \frac{|T_s(\text{idle}) - T_s(\text{brushing})|}{r_b(\text{compressed})}$$

where $T_s(\text{idle})$ represents an initial torque present in a shaft of a motor (e.g., motor 111) rotationally driving a scrubbing brush 106a-b in an open (non-contact) position relative to the substrate W, $r_b(\text{compressed})$ represents a distance (smaller than an uncompressed radius of the brush) between the axis of rotation of the brush 106a-b and the major surface of the substrate W after the brush 106a-b has been compressed against a major surface of the substrate W, and $T_s(\text{brushing})$ represents the torque in the shaft of the motor as the brush 106a-b rotates and scrubs the substrate W while the axis of the brush 106a-b is located at $r_b(\text{compressed})$ from the substrate's major surface.

$T_s(\text{idle})$ may be measured initially, such as before the scrubber box 101 is placed into service, and/or at a later time when recalibration of the scrubber box 101 is desired. Paired values for $r_b(\text{compressed})$ and $T_s(\text{brushing})$ may be obtained experimentally (e.g., based on calibration tests performed on the particular model of scrubber brush used).

A zero point for a scrubbing brush 106a-b relative to the major surface of the substrate W, which corresponds to the largest value of $r_b$ consistent with the brush 106a-b still contacting the major surface of the substrate W, may be found by monitoring and/or measuring the torque $T_s$ of the motor that drives the brush 106a-b as the brush 106a-b is moved relative to the substrate W. For example, a rotating brush may be placed in an initial position at which the rotating brush is compressed against the major surface of the substrate W, and the torque $T_s$ may be monitored as the rotating brush is backed away from the substrate W to determine the position of the respective support 107, 109 relative to the base 113 when the torque $T_s$ reaches $T_s(\text{idle})$ This occurs at the point when a gap between the brush 106a-b and the major surface of the substrate W is beginning to be formed. Alternatively, a rotating brush may be placed in an initial position at which the rotating brush is spaced apart from the major surface of the substrate W, and the torque $T_s$ may be monitored as the rotating brush is moved toward the substrate W to determined the position of the respective support 107, 109 relative to the base 113 when the torque $T_s$ begins to rise from a baseline value of $T_s(\text{idle})$. This occurs at the point when a gap between the brush 106a-b and the major surface of the substrate W has just been closed.

Once the zero point for a scrubbing brush 106a-b is found, the respective support 107, 109 may be moved toward the substrate W along the base 113 by an increment corresponding to that degree of compression in the brush 106a-b which the prior testing indicated corresponds to the desired amount of scrubbing force $F_s$. For example, a scrubbing brush 106a-b may be moved toward the major surface of the substrate W to the extent of a predetermined distance obtained by subtracting $r_b$ (compressed) from the (known) radial outline dimension of the brush used in the previous scrubbing force calibration testing described above. Additional torque monitoring techniques that may be employed are described in previously incorporated U.S. Pat. No. 6,986,185. As indicated in U.S. Pat. No. 6,986,185, the scrubber box 101 may include a torque monitor to make the above described measurements.

Toe-in of Brush Rollers

The present invention also provides for convenient adjustment of a toe-in angle between the first and second brushes 106a-b. For example, on a side 121 (FIG. 1A) of the tank 103 opposite to where the first actuator 115 urges the first and second supports 107, 109 through their respective arcs $A_1$, $A_2$ relative to the base 113, the scrubber box 101 may comprise a first bearing 123 (FIG. 2) slideably mounted on the base 113 for pivotally supporting the first support 107 and a second bearing 125 (FIG. 2), also slideably mounted on the base 113, for pivotally supporting the second support 109.

Figure 4:
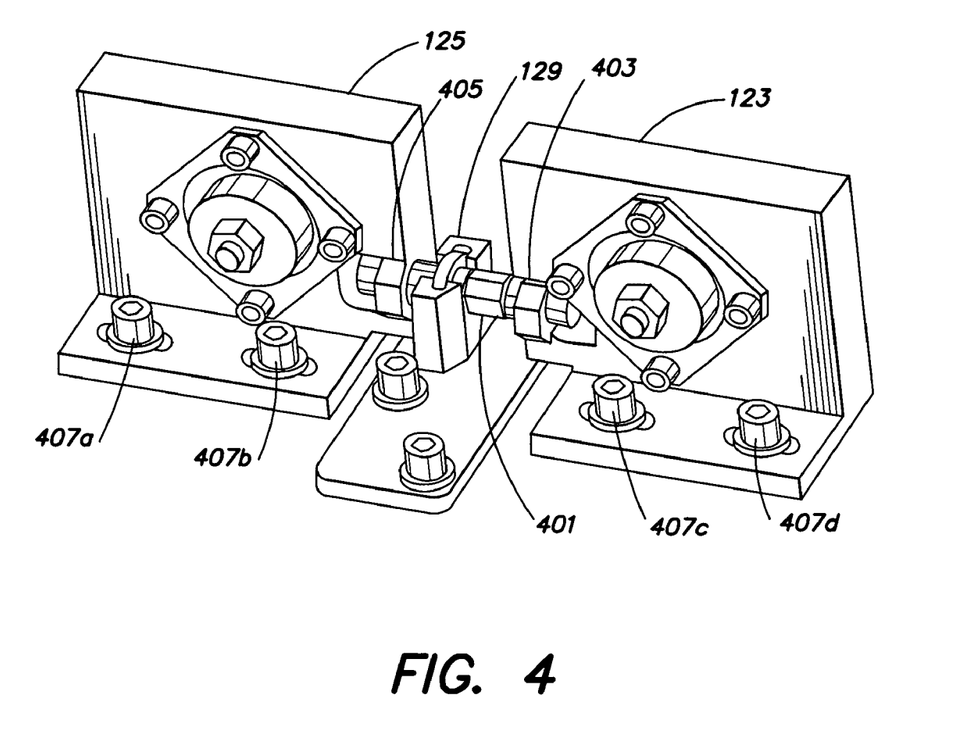
FIG. 4 is a perspective view of an inventive bearing arrangement that may be employed to adjust brush toe-in-angle in accordance with the present invention.

As illustrated in FIG. 4, in one or more embodiments, a second actuator 129 may be fixedly mounted to the base 113 between the first and second slideably mounted bearings 123, 125. The second actuator 129 may be adapted to provide accurate adjustment of the distance between the first and second bearings 123, 125 and thereby, provide precise adjustment of the toe-in angle. Thus, as shown in FIG. 4, the first and second bearings 123, 125 may be adapted to slide or reciprocate relative to one another (e.g. such that a toe-in angle between the first and second brushes 106a-b increases and/or decreases along with a distance between the first and second bearings 123, 125).

In some embodiments, the second actuator 129 may comprise a lead screw 401 (FIG. 4) adapted to symmetrically change the distance between the bearings 123, 125. For example, such a lead screw may comprise left and right threads (not shown) for cooperation with complementary collars 403, 405 on the first and second bearings 123, 125.

Appropriate fasteners or other retaining mechanisms (e.g., screws 407a-d) may be used to slideably mount the first and second bearings 123, 125 to the base 113. Such fasteners may be loosened to allow position adjustment of the bearings 123, 125; and then tightened to retain the adjusted bearing position.

Figure 5:
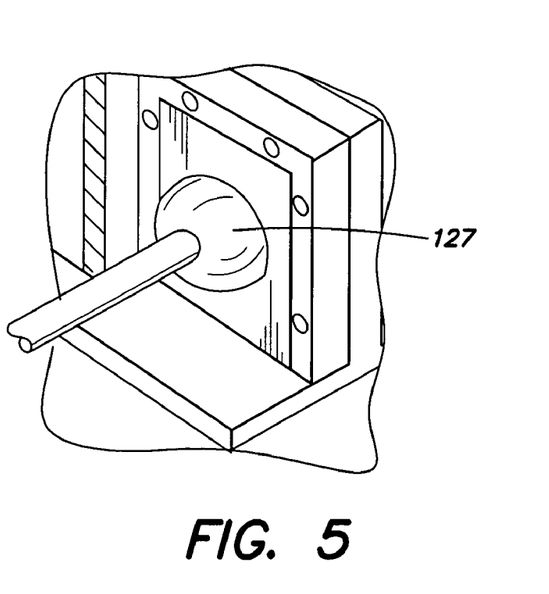
FIG. 5 is a partial, cross-sectional view of an exemplary spherical bearing that may be employed within the inventive scrubber box.

To flexibly accommodate both toe-in angle adjustment and smooth pivoting motion of the supports 107, 109 relative to the base 113, some or all of the bearings between the supports 107, 109 and the base 113, including the first and second bearings 123, 125, may comprise spherical and/or gimbal-type support surfaces and/or low-friction plastic materials such as polytetrafluoroethylene (PTFE). For example, FIG. 5 is a partial, cross-sectional view of an exemplary spherical bearing 127 that may be employed for the first and/or second bearings 123, 125 (and/or for one or both of the bearings 128a, 128b (FIG. 1A) that couple to the supports 107, 109 on the first actuator 115 side of the scrubber box 101).

Additional and/or alternative toe-in adjustment mechanisms also may be employed, as described, for example, in previously incorporated U.S. patent application Ser. No. 10/283,030, filed Oct. 29, 2002.

Water-lubrication of Rotary Bearings

It is known to direct a flow of fluid to the major surfaces of a substrate within a scrubber tank by directing a flow of fluid under pressure into a scrubber brush. For example, an axially-disposed fluid entry port at a motor end of a scrubber brush may be employed to cause pressurized fluid to flow radially out of the brush via pores adjacent the substrate-scrubbing surfaces of the brush. In one or more embodiments of the present invention, such a pressurized flow of fluid into a scrubber brush may additionally be employed to lubricate one or more bearings of the inventive scrubber box 101. For example, a rotary support 130 (FIG. 1B) may be provided (e.g., at the non-motor end 121 of the scrubber brush box 101) and may include one or more water-lubricatable bearings (described below with reference to FIG. 6)), and hydraulic communication may be provided between the water-lubricated bearings and a fluid-containing internal portion of a scrubber brush.

Figure 6:
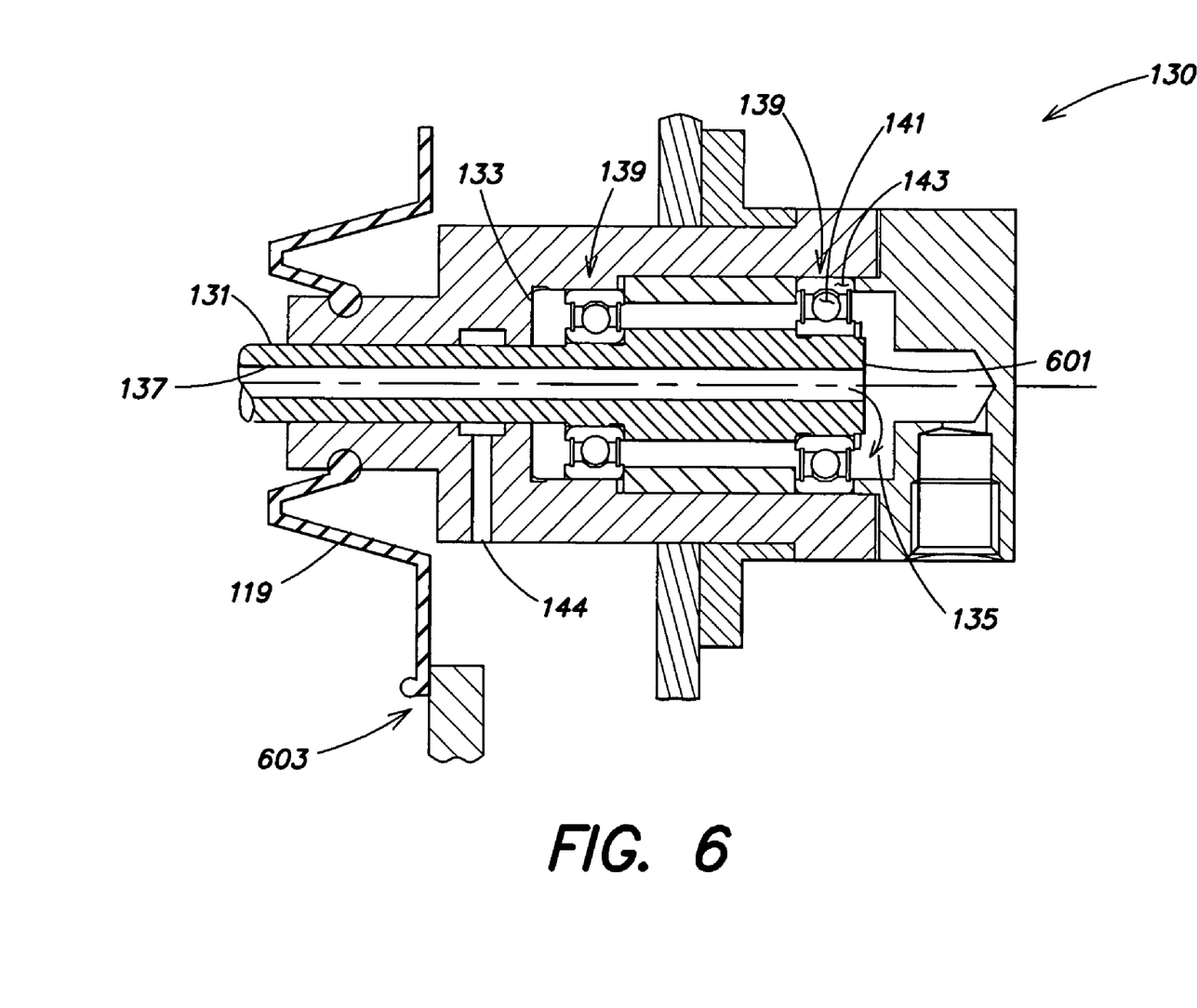
FIG. 6 is a cross-sectional view of a portion of an inventive rotary shaft that may be employed at an end of a scrubber brush in accordance with the present invention.

FIG. 6 is a cross-sectional view of a portion of an inventive rotary support 130 that may be employed, for example, at the non-motor end 121 (FIG. 1B) of a scrubber brush 106a and/or 106b. With reference to FIG. 6, the rotary support 130 includes a rotary shaft 131 that protrudes into an enclosure 133 formed within the rotary support 130. A fluid port 137 may be axially disposed in the rotary shaft 131 so as to terminate at the enclosure 133 and permit a flow of fluid into the enclosure 133. For example, a fitting or other coupling (not shown) may be coupled to the rotary support 130 and employed to supply fluid (e.g., water) to the fluid port 137. In one embodiment of the invention, 2-3% of the total flow of fluid through the fluid port 137 may be directed into the enclosure 133 (e.g., by traveling left to right along the fluid port in FIG. 6 and as indicated by arrow 135). Other amounts of the total fluid flow also may be used. The diverted fluid flow may be caused to lubricate bearings 139 disposed in the rotary support 130 (e.g., the fluid may be permitted to penetrate and/or flow through the bearings 139). In some such embodiments, the rotary support 130 at the non-motor end 121 may comprise one or more polymer or ceramic ball bearings 141 adapted to be lubricated with water, a water-based fluid, and/or another type of fluid. The rotary shaft 131 and/or the bearing housings 143 may further comprise a polymer/plastic to reduce the potential for particle generation and provide compatibility with the fluid used for lubrication (e.g., water although other fluids may be employed). The rotary support 130 may also provide for venting of the flow of lubricating fluid outward of the scrubber box 101 so as to purge any particles generated by the bearings 139 and/or any undesirable chemicals associated therewith, and to prevent the same from entering the tank 103 (FIG. 1A). For example, a drain 144 may be formed within the rotary support 130 that surrounds the rotary shaft 131 to allow any fluid that flows past the bearings 139 and along the rotary shaft 131 toward the tank 103 (e.g., right to left in FIG. 6) to be collected and drained before the fluid enters the tank 103.

In another embodiment of the invention, a rotary union may be employed at an end 601 of the rotary shaft 131. For example, a Deublin model 20211-600 rotary union with silicon carbide face mechanical seals or other suitable rotary union may be employed.

As shown in FIG. 6, the coupling element 119 may be employed to seal the rotary support 130 from the tank 103. The coupling element 119 may comprise a bellows or similar dynamic seal (e.g., a dynamic linear reciprocal seal). A static seal (not shown) may be employed at the junction between the coupling element 119 and the tank 103 as indicated at by reference number 603.

Increased Diameter Idler Roller

Figure 7:
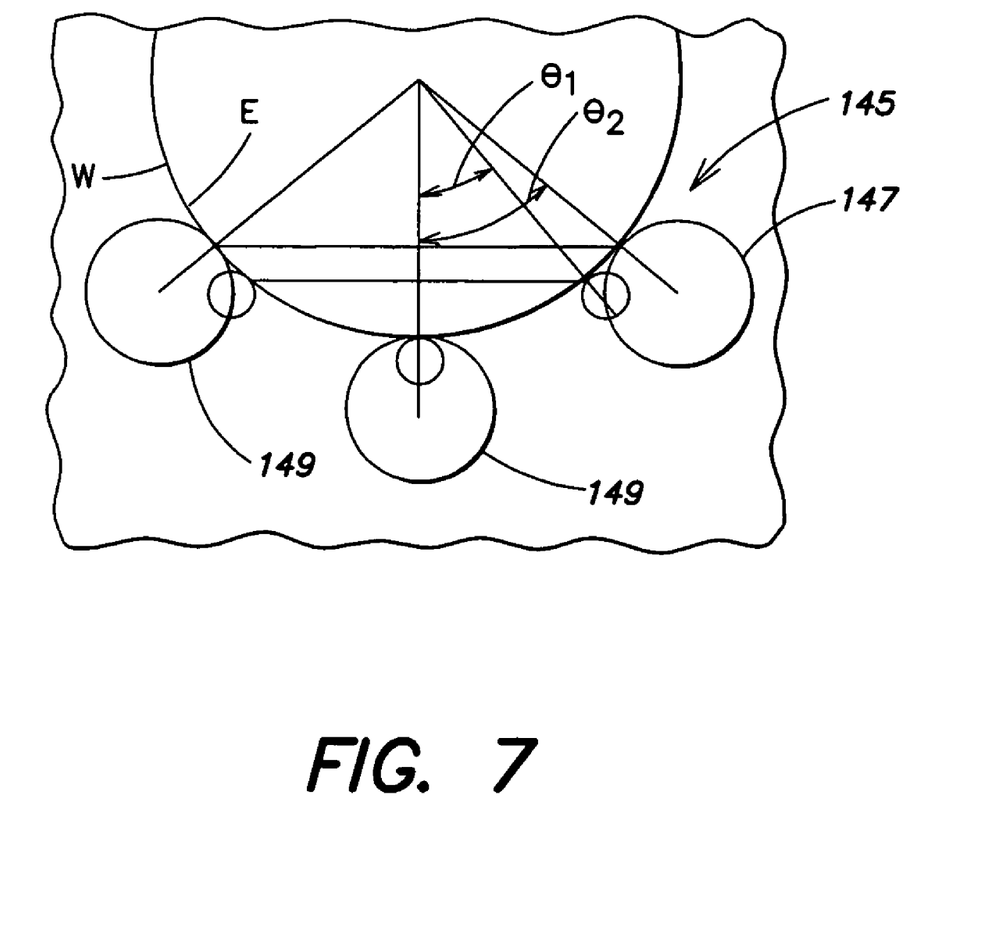
FIG. 7 is a side, schematic view of an inventive roller arrangement that may be employed within the scrubber box of FIGS. 1A-2 to support and/or rotate a substrate.

FIG. 7 is a side, schematic view of an inventive roller arrangement 145 that may be employed within the scrubber box 101 of FIGS. 1A-2 to support and/or rotate the substrate W. With reference to FIG. 7, the roller arrangement 145 includes an idler roller 147 and two drive rollers 149. The diameter of the idler roller 147 is slightly larger (e.g., 0.005-0.010 inches larger) than the diameters of the two drive rollers 149 which, in some embodiments, are approximately 2.5 inches in diameter. In at least one embodiment of the invention, the angle between the rollers 149, 147 may be about 50° as shown by angle $\theta_2$, rather than a more conventional angle of about 40° as shown by angle $\theta_1$. It will be understood that other angles also may be employed.

In operation, during rotation of the substrate W in a scrubber box comprising the above roller arrangement 145 of an idler roller 147 of a relatively large diameter and first and second drive rollers 149 of a relatively smaller diameter, each of the idler roller 147 and the first and second drive rollers 149 may simultaneously achieve contact with, and reliably remain in contact with, the peripheral edge E of the substrate W as the substrate W rotates along with the idler 147 and drive rollers 149. By contrast, in one or more known arrangements in which the respective diameters of the idler roller and the drive rollers at least are nominally the same, variation in the diameters of roller diameters within manufacturing tolerances around the nominal diameter may result in one of the drive rollers or the idler roller failing to achieve or maintain contact with the edge of the substrate during substrate rotation.

In one or more embodiments, where the larger-diameter idler roller 147 of the present invention contacts the edge E of the rotating substrate W, the idler roller may exhibit greater compressibility compared to corresponding edge-contact regions on the drive rollers 149. Such an arrangement may, for example, ensure that contact between the substrate edge and the larger-diameter idler roller 147 does not result in the substrate edge being displaced away from either or both of the drive rollers 149.

Also, in some such embodiments and/or in one or more other embodiments, the idler roller 147 may be equipped with an additional source of rotational torque (e.g., besides the torque of the drive rollers 149 as transmitted by the rotating substrate W). For example, the idler roller 147 may be equipped with a separate drive motor (e.g., motor 701 in FIG. 1A) so that the idler roller 147 and drive roller 149 rotate at different speeds (e.g., as to permit selective substrate edge cleaning via sliding contact where the idler roller 147 contacts the substrate edge). In some such embodiments the idler roller 147 may be selectively coupled and/or decoupled from the additional source of rotational torque.

It will be understood that in other embodiments of the invention, the idler roller 147 and drive rollers 149 may be similarly sized. Furthermore, other arrangements of the drive and idler rollers may be employed. For example, the idler roller 147 may be disposed between the drive rollers 149.

Substrate Rotation Sensor

Figure 8:
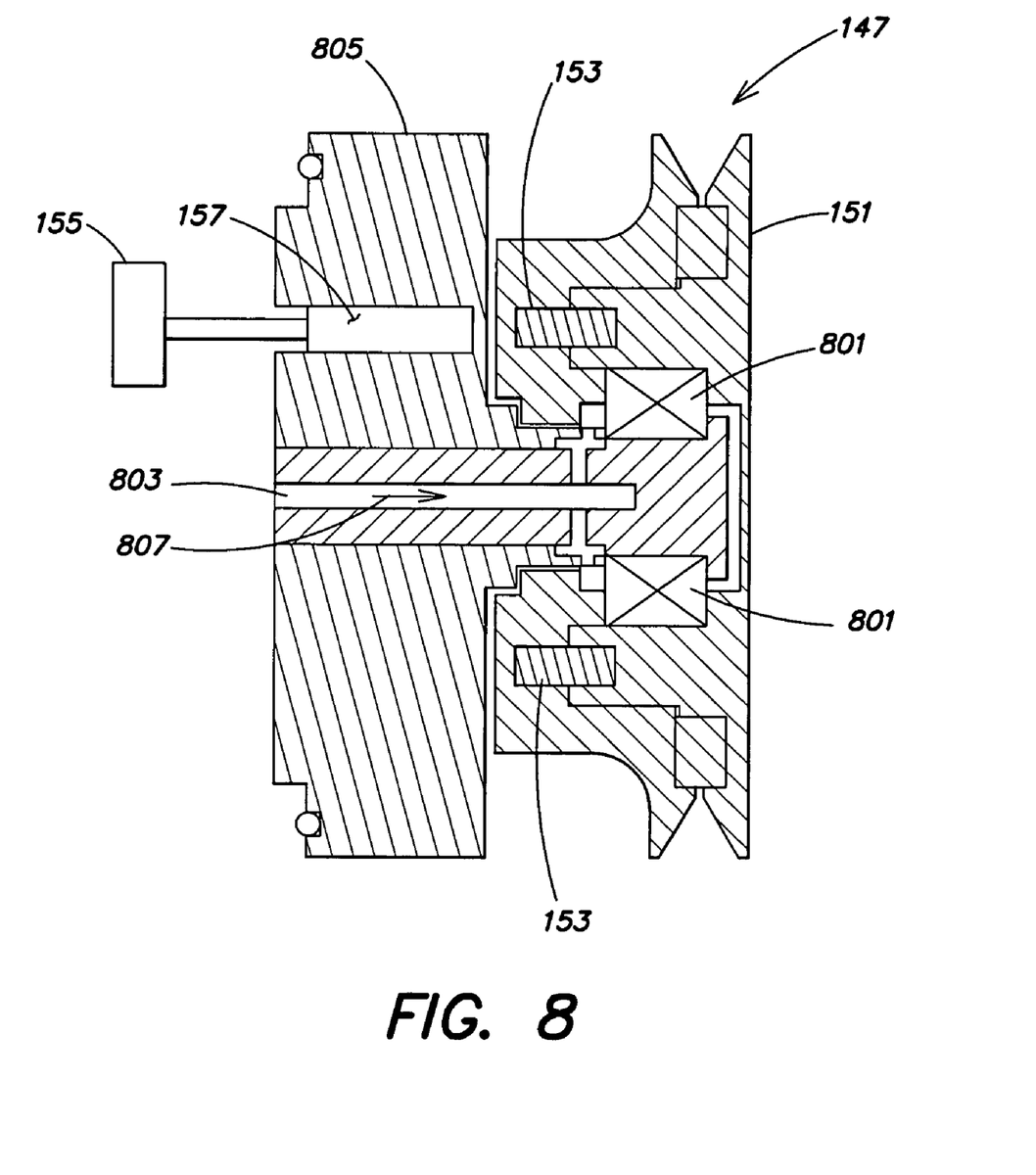
FIG. 8 is a side, cross-sectional view of an exemplary inventive idler roller.

In one or more further embodiments of the invention, the idler roller 147 (and/or one or more of the drive rollers 149) may be adapted to provide a rotations per minute (RPM) reading. For example, FIG. 8 is a side, cross-sectional view of an embodiment of the idler roller 147. As illustrated in FIG. 8, the idler roller 147 may comprise a housing 151, and one or more magnets 153 embedded in the housing 151 and adapted to interact with a proximity sensor 157 (e.g. Hall effect-based sensors, inductive-based sensors, etc.). More specifically, as the idler roller 147 rotates, the one or more magnets 153 may interact with the proximity sensor 157 as the one or more magnets 153 pass the proximity sensor 157 so as to generate electrical pulses at a rate corresponding to a rate of rotation of the idler roller 147. In some such embodiments, a controller 155 may be adapted to receive the pulses and convert the pulses into an RPM reading of the substrate.

Water-lubrication of Roller Bearings

As further shown in FIG. 8, in at least one embodiment of the invention, the idler roller 147 may employ a water-lubricated bearing 801. For example, an inlet 803 may be formed on a backside of a spindle housing 805 about which the idler roller 147 rotates. The inlet 803 allows fluid (e.g., water) to travel toward and lubricate the bearing 801 as indicated by arrow 807. One or more of the drive rollers 149 may be similarly configured.

In some embodiments, the idler roller 147 may comprise one or more polymer or ceramic spherical bearings adapted to be lubricated with water and/or a water-based fluid. The idler roller 147 and/or the bearing housing 151 may further comprise a polymer/plastic to reduce the potential for particle generation and provide compatibility with the fluid used for lubrication (e.g., typically water although other fluids may be employed). The bearing housing 151 may also provide for venting of the flow of lubricating fluid outward of the scrubber box 101 so as to purge any particles generated by the bearing 801 and/or any undesirable chemicals associated therewith, and to prevent the same from entering the tank 103 (FIG. 1A).

Slotted Rollers

Figure 9:
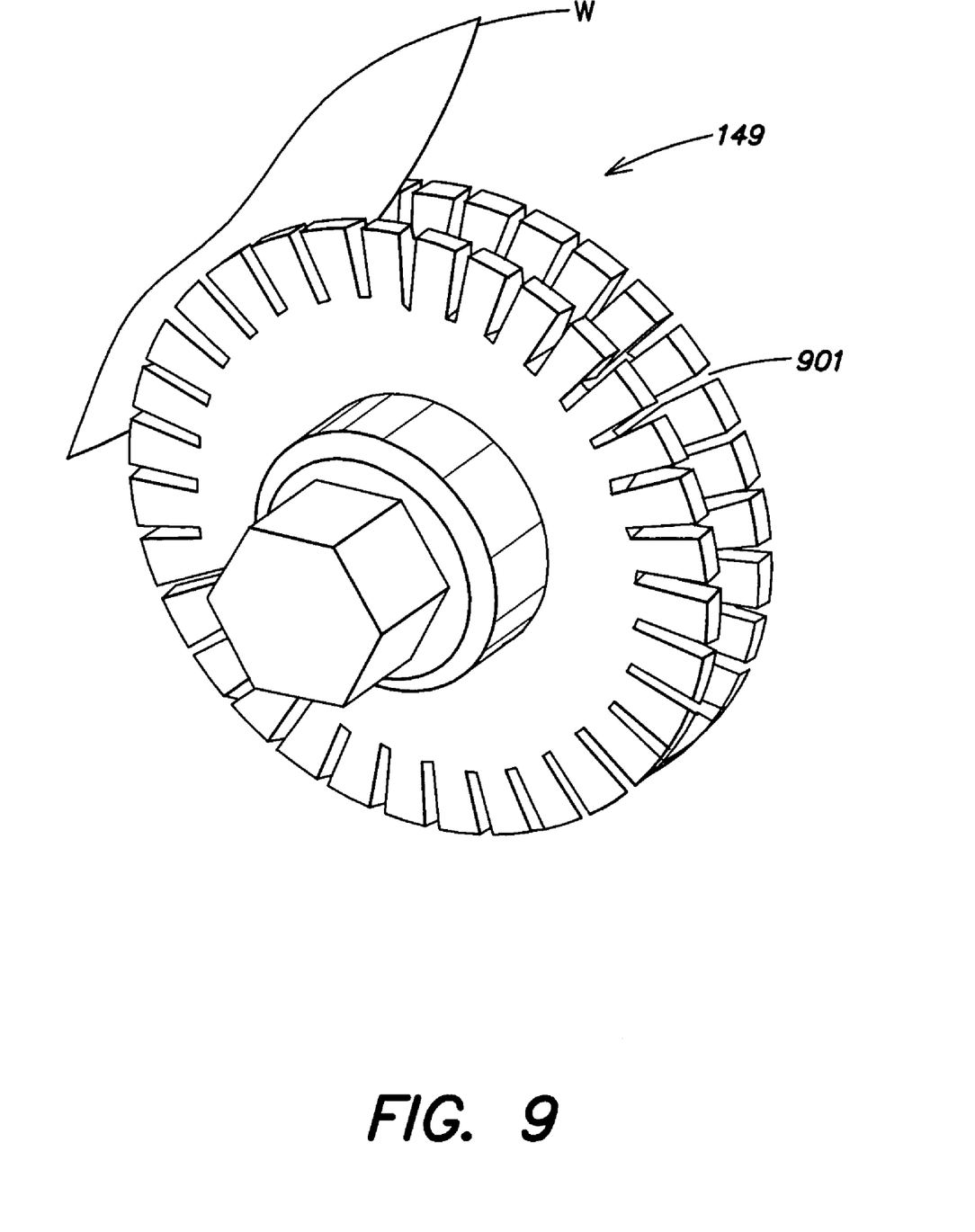
FIG. 9 is a side perspective view of an exemplary drive roller provided in accordance with another embodiment of the invention.

FIG. 9 is a side perspective view of one of the drive rollers 149 provided in accordance with another embodiment of the invention. As shown in FIG. 9, the drive roller 149 includes a plurality of slots 901 or other openings formed within each side of the drive roller 149. In the embodiment shown, 32 slots 901 are evenly spaced about the circumference of the roller 149 and have a width of about 0.03 inches and a depth of about 0.06 inches for an idler roller having a diameter of about 2.5 inches. Other numbers and/or spacing/dimensions of slots may be employed. The slots 901 preferably extend to (or below) the surface of the roller 149 that contacts the substrate W. In this manner, the slots 901 allow liquid to escape from the surface of the roller 149 that contacts the substrate W so as to increase the gripping force between the substrate W and the roller 149. Holes or other surface features also may be employed, as described for example, in previously incorporated U.S. patent application Ser. No. 09/580,880, filed May 30, 2000. The idler roller 147 may be similarly configured with slots and/or other surface features.

Polymer Coated Motor Shaft

Figure 10A:
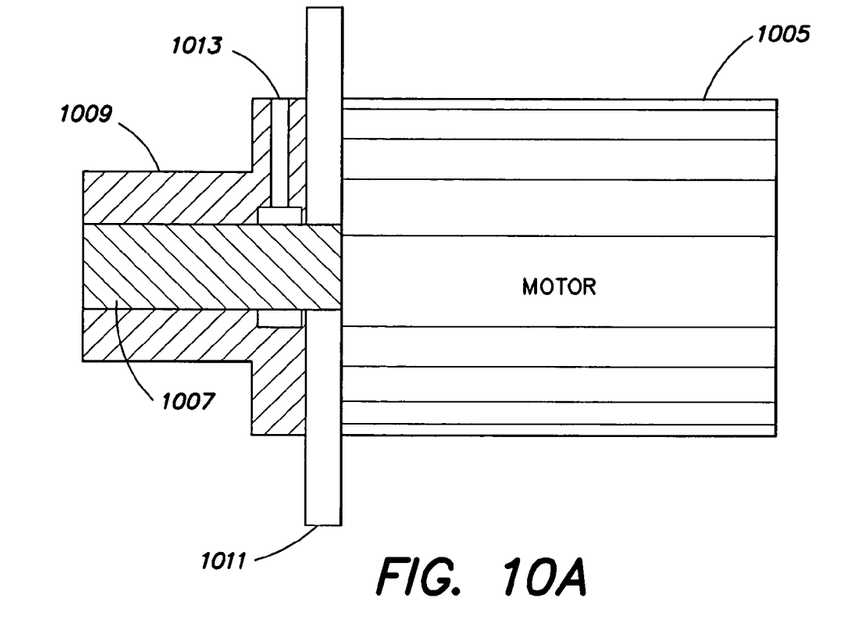
FIG. 10A is a partial cross-sectional view of a first exemplary embodiment of a polymer capped motor shaft provided in accordance with the invention.

In yet another embodiment of the invention, the shaft of one or more of the brush motors 111 (FIG. 1A), drive roller motors (e.g., motors 1001 and 1003 in FIG. 1A), or idler roller motor 701 (FIG. 1A) may include a polymer coating and/or polymer cap. Such a cap and/or coating may protect the motor shaft from any chemistry employed during substrate scrubbing. For example, FIG. 10A is a partial cross-sectional view of a first exemplary embodiment of a polymer capped motor shaft. With reference to FIG. 10A, a motor 1005 is shown having a shaft 1007. A polymer cap 1009, formed from polyphenylene sulfide (PPS) or another suitable material, is disposed around and coupled to a mounting bracket 1011 of the motor 1005. Suitable seals (not shown) may be employed to seal the polymer cap 1009 relative to the motor 1005 and/or shaft 1007. Further, a gas purge channel 1013 may be formed within the polymer cap 1009 to allow nitrogen or a similar purge gas to flow around the shaft 1007 to further discourage fluid from traveling up the shaft 1007 toward the motor 1005.

Figure 10B:
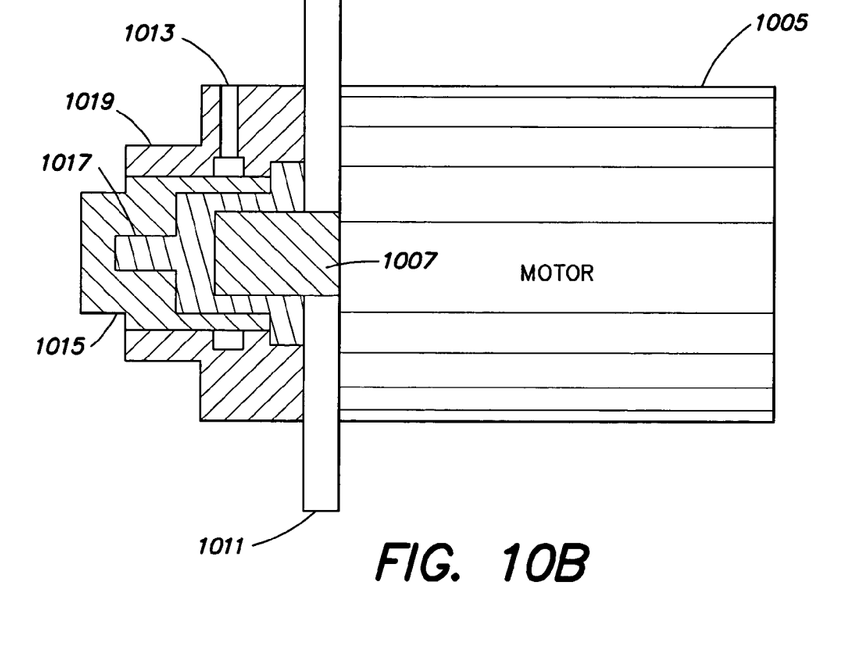
FIG. 10B illustrates an alternative polymer cap arrangement for the motor of FIG. 10A.

FIG. 10B illustrates an alternative polymer cap arrangement for the motor 1005 of FIG. 10A. In FIG. 10B, a first polymer cap or coating 1015 is attached to and/or formed on a shaft elongation member 1017. The shaft elongation member 1017, in turn, is coupled to the motor shaft 1007 (e.g., via a set screw or other suitable mechanism not shown). A second polymer cap 1019 may be further coupled to the first polymer cap or coating 1015 and to the bracket 1011, and employed to provide the gas purge channel 1013 described above with reference to FIG. 10A. Suitable seals (not shown) may be employed to seal the second polymer cap 1019 relative to the motor 1005 and/or first polymer cap or coating 1015.

The shaft elongation member 1017 may comprise the same material as the motor shaft 1007 (e.g., stainless steel), or another suitable material. By employing a separate shaft elongation member 1017, a more durable gluing or bonding process may be employed to secure the first polymer cap or coating 1015 to the shaft elongation member 1017 than may be employed on the motor 1005/motor shaft 1007. Likewise, unlike the motor 1005, the shaft elongation member 1017 may be directly exposed to a polymer deposition process and then attached to the motor shaft 1007.

Brush Gap Calibration

As described above, the zero point for scrubbing brushes 106a-b (FIG. 1B) relative to the major surfaces of a substrate W, which corresponds to the largest value of $r_b$ consistent with the brushes 106a-b still contacting the major surface of the substrate W, may be found by monitoring the torque $T_s$ of the motor that drives the brushes 106a-b as the brushes 106a-b are moved to contact the substrate W. In an alternative embodiment, instead of locating the zero point for scrubbing brushes relative to a substrate by monitoring the torque of the motors 111 that drive the brushes 106a-b, a "zero-gap" position between the two scrubber brushes 106a-b may be determined in order to calibrate the position of the brushes 106a-b.

Figure 11:
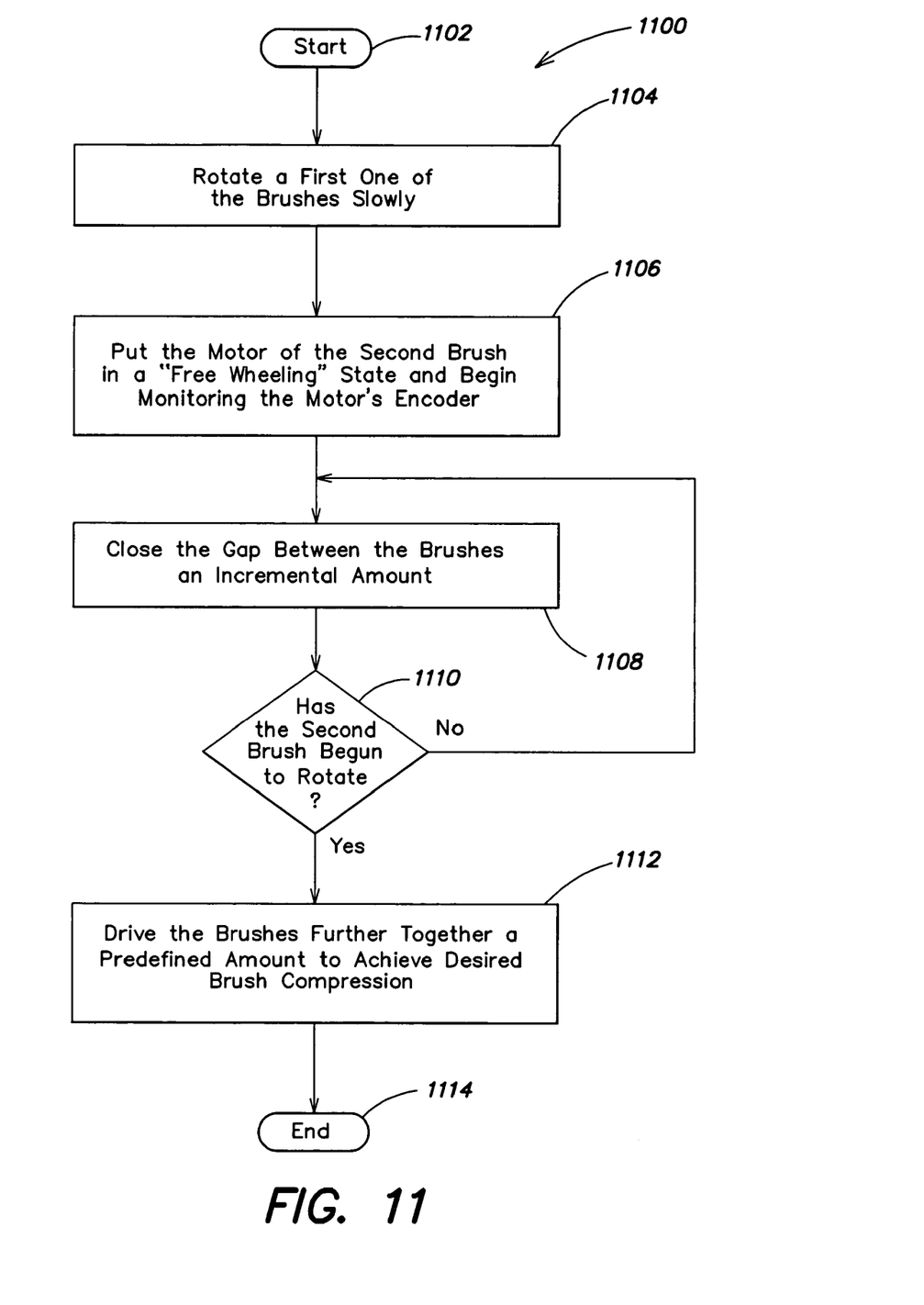
FIG. 11 is a flowchart illustrating an example embodiment of a brush gap configuration method according to the present invention.

Referring to FIG. 11, a brush gap calibration method 1100 may include the following steps. According to the present invention, a gap between the brushes 106a-b may be incrementally closed while a first brush 106a is rotated and the second brush 106b is stationary but free to rotate. As indicated above, the brushes 106a-b may normally be driven by independent servo motors 111 that each include an encoder. In Step 1102 the method begins. In Step 1104, the first brush 106a may be driven at a slow speed. In some embodiments, a slow speed is selected to minimize the chance that eventual impact between the brushes 106a-b damages either of the brushes 106a-b. In Step 1106, the second brush 106b is not driven, the corresponding motor 111 coupled to the second brush 106b is put in a "free wheeling" state, and the encoder of the corresponding motor 111 is monitored. In Step 1108, the gap between the brushes 106a-b is closed an incremental amount. As the process 1100 loops between Steps 1108 and 1110, the driven first brush 106a eventually contacts the stationary second brush 106b and causes it to rotate from contact friction. At the point that encoder feedback of the motor 111 coupled to the stationary brush 106b indicates that the stationary brush 106b is being rotated, the position of the brushes 106a-b is identified as the zero-gap position and the process 1100 moves to Step 1112. In Step 1112, using the zero-gap position as a starting point, a defined amount of brush compression may achieved by further driving the brushes 106a-b together a predefined amount as described above. In Step 1114, the inventive calibration process completes.

In some embodiments, a controller (such as the controller 104 of FIG. 1B) driven by software may be employed to automatically perform this calibration process after new brushes are installed, brush wear necessitates recalibration of the zero-gap, and/or anytime there is no substrate between the brushes. There are several advantages to this calibration method. Additional sensors, calibration tools, and measurements are not required. Personnel are not required to contact the inside of the scrubber box. Variations in brush diameter and other device tolerances are automatically compensated for by the present invention.

The foregoing description discloses only exemplary embodiments of the invention. Modifications of the above disclosed apparatus and methods which fall within the scope of the invention will be readily apparent to those of ordinary skill in the art. For instance, the shape of the supports 107, 109 in FIGS. 1A-3 is merely exemplary. In one embodiment, the supports 107, 109 may be more u-shaped (e.g., so as to extend primarily from one end of a brush down to the base 113, along the base 113 and up to the other end of the brush). Accordingly, while the present invention has been disclosed in connection with exemplary embodiments thereof, it should be understood that other embodiments may fall within the spirit and scope of the invention, as defined by the following claims.

What is claimed is:

1. A scrubber box, comprising:
   a tank adapted to receive a substrate for cleaning;
   a first support outside of the tank and adapted to couple to ends of a first scrubber brush disposed within the tank;
   a first motor mounted to the first support and adapted to rotate the first scrubber brush;
   a second support outside of the tank and adapted to couple to ends of a second scrubber brush;
   a second motor mounted to the second support and adapted to rotate the second scrubber brush;
   a base to which the first and second supports are pivotally mounted via spherical bearings adapted to permit toe-in of the first and second scrubber brushes;
   a brush gap actuator adapted, via a crank and rocker mechanism, to substantially simultaneously pivot the first and second supports toward or away from each other so as to permit the first and second scrubber brushes to substantially simultaneously achieve or break contact with the substrate; and
   a toe-in actuator adapted to move two of the spherical bearings toward or away from each other so as to adjust a toe-in angle between the first and second scrubber brushes.

2. The scrubber box of claim 1 wherein the motors each include a drive shaft and a polymer cap coupled to a mounting bracket of each of the motors,
   wherein the polymer cap is disposed around the drive shaft and includes a gas purge channel, and
   wherein the drive shaft protrudes through the polymer cap and the polymer cap is adapted to prevent process fluid from the scrubber box from reaching the motor.

3. The scrubber box of claim 1 further comprising:
   a first drive roller;
   a second drive roller; and
   an idler roller,
   wherein the first drive roller, the second drive roller, and the idler roller are disposed within the tank and adapted to rotate a substrate,
   wherein the idler roller is of a larger diameter than that of the first and second drive rollers.

4. The scrubber box of claim 3 wherein the diameter of the idler roller is large enough to maintain contact between the rollers and the substrate.

5. The scrubber box of claim 3 further comprising a controller coupled to the motors and the brush gap actuator, and adapted to locate a zero point position of the scrubber brush based upon a change in torque exerted by the motor to rotate the scrubber brush as the actuator moves the brush support.

* * * * *